US008191980B2

(12) United States Patent
Yun et al.

(10) Patent No.: US 8,191,980 B2
(45) Date of Patent: *Jun. 5, 2012

(54) PROCESSING IMAGE DATA

(75) Inventors: Kwansoo Yun, Suwon-si (KR);
Shashank Goel, Karnataka (IN);
Sangdo Cho, Seongnam-si (KR);
Jaewoo Joung, Suwon-si (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 541 days.

This patent is subject to a terminal disclaimer.

(21) Appl. No.: 12/421,166

(22) Filed: Apr. 9, 2009

(65) Prior Publication Data
US 2010/0002031 A1 Jan. 7, 2010

(30) Foreign Application Priority Data
Jul. 1, 2008 (KR) .................. 10-2008-0063649

(51) Int. Cl.
B41J 29/38 (2006.01)
B41J 29/393 (2006.01)
G06F 15/00 (2006.01)

(52) U.S. Cl. .................. 347/9; 347/14; 347/19; 358/1.9
(58) Field of Classification Search ................. 347/9, 14, 347/19; 358/1.9
See application file for complete search history.

(56) References Cited

U.S. PATENT DOCUMENTS

| 7,314,269 B2 * | 1/2008 | Kusunoki ........................ 347/19 |
| 2003/0099394 A1 * | 5/2003 | Shimazawa ................... 382/164 |
| 2008/0279441 A1 * | 11/2008 | Matsuo et al. ................ 382/133 |

* cited by examiner

Primary Examiner — Matthew Luu
Assistant Examiner — Jannelle M Lebron
(74) Attorney, Agent, or Firm — McDermott Will & Emery LLP

(57) ABSTRACT

A method of processing image data is disclosed. According to an embodiment of the present invention, the method, which obtains image data for printing the edge of a circular pad having a radius of R by forming ink blots having a radius of r in an overlapping manner, includes: setting a permissible pitch range as a distance between adjacent ink blots; arranging first image data to the edge of the pad, in an x-y coordinate system; generating second image data with a smaller radius than the first image data, the second image data sharing the center with the first image data; arranging a first base point on the second image data; selecting the first determination point on the second image data separated from the first base point; determining if a distance between the first base point and the first determination point is within the permissible pitch range; and storing a coordinate, located at a shortest distance from the first determination point, as print data.

16 Claims, 12 Drawing Sheets

PROCESSING IMAGE DATA

CROSS-REFERENCE TO RELATED APPLICATIONS

This application claims the benefit of Korean Patent Application No. 10-2008-0063649, filed with the Korean Intellectual Property Office on Jul. 1, 2008, the disclosure of which is incorporated herein by reference in its entirety.

BACKGROUND

1. Technical Field

The present invention relates to a method of processing image data and a recorded medium tangibly embodying the method.

2. Description of the Related Art

Currently, the inkjet printing technology is widely used, not only in office applications but also in industrial applications. One such an example is the use of inkjet printing in processes for manufacturing a printed circuit board (PCB).

A printed circuit board may generally be designed using a layout software, where the design may include various shapes (for example, wide lines, circles, arcs, polygons, hollow circles, and interconnections). In printing these various shapes, an inkjet printer may eject ink droplets, which may form ink blots having a circular shape.

Since the inkjet printer may operate based on a raster image format, the various shapes may have to be filled with simulated ink blots, i.e. circles, and then saved as an image file format.

In order to ensure smoothness and avoid empty areas and thus provide the resolution and ink density required by the user, it is needed to carefully place the ink blots along the boundaries and in the interiors of the shapes that are to be printed.

SUMMARY

An aspect of the invention provides a method of processing image data and a recorded medium tangibly embodying a set of instructions for implementing the method, which can be utilized to print pads with a high level of surface smoothness and high reliability.

Another aspect of the invention provides a method of processing image data and a recorded medium tangibly embodying a set of instructions for implementing the method. The method, which obtains image data for printing the edge of a circular pad having a radius of R by forming ink blots having a radius of r in an overlapping manner, includes: setting a permissible pitch range for a distance between adjacent ink blots; arranging first image data about the edge of the pad in an x-y coordinate system; generating second image data with a smaller radius than the radius of the first image data, the second image data sharing the center with the first image data; arranging a first base point on the second image data; selecting a first determination point on the second image data, the first determination point separated from the first base point; determining whether a distance between the first base point and the first determination point is within the permissible pitch range; and storing a coordinate as print data if the distance between the first base point and the first determination point is within the permissible pitch range, the coordinate located at a shortest distance from the first determination point.

Here, a radius of the second image data can be R−r.

In addition to the above, if the distance from the first base point to the first determination point is beyond the permissible pitch range, the first determination point can be moved on the second image data, and then the determining of whether the distance between the first base point and the first determination point is within the permissible pitch range can be repeated.

In addition, the first image data can be obtained by converting vector data of the edge of the pad by using Bresenham's algorithm.

The storing of a coordinate located at the shortest distance from the determination point as print data is performed for a coordinate located inside the second image data.

The method further includes: after the storing of the coordinate located at the shortest distance from the first determination point as print data, arranging the stored coordinate as a second base point; selecting a second determination point on the second image data, the second determination point separated from the second base point; determining whether a distance between the second base point and the second determination point is within the permissible pitch range; and storing a coordinate as print data if the distance between the second base point and the second determination point is within the permissible pitch range, the coordinate located at a shortest distance from the second determination point.

Again, the method can further include: dividing the second image data into n equal parts (n being a natural number of 2 or greater), in which the storing as print data is performed for one of the n equal parts, and print data for any one of the remaining n equal parts is obtained by mirror image conversion.

Here, the natural number n can be an even number.

Additional aspects and advantages of the present invention will be set forth in part in the description which follows, and in part will be obvious from the description, or may be learned by practice of the invention.

DETAILED DESCRIPTION

Figure 1:
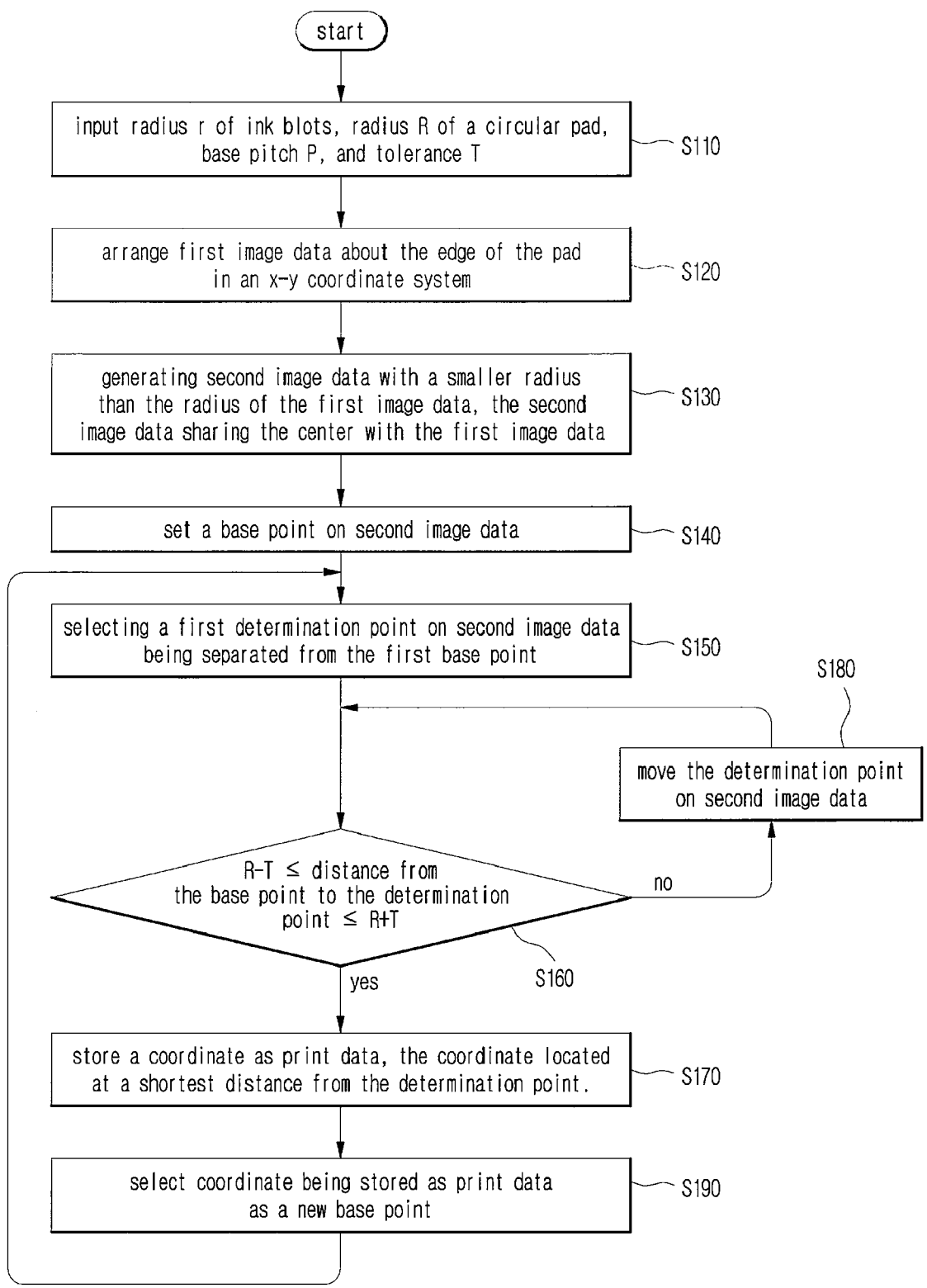
FIG. 1 is a flowchart illustrating a method of processing image data in accordance with an embodiment of the present invention.

As the invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In the description of the present invention, certain detailed explanations of related art are omitted when it is deemed that they may unnecessarily obscure the essence of the invention.

While such terms as "first" and "second," etc., may be used to describe various components, such components must not be limited to the above terms. The above terms are used only to distinguish one component from another. For example, a first component may be referred to as a second component without departing from the scope of rights of the present invention, and likewise a second component may be referred to as a first component. The term "and/or" encompasses both combinations of the plurality of related items disclosed and any item from among the plurality of related items disclosed.

The terms used in the present specification are merely used to describe particular embodiments, and are not intended to limit the present invention. An expression used in the singular encompasses the expression of the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

A method of processing image data and a recorded medium tangibly embodying the method in accordance with certain embodiments of the present invention will be described below in more detail with reference to the accompanying drawings. Those components that are the same or are in correspondence are rendered the same reference numeral regardless of the figure number, and redundant explanations are omitted.

Figure 2:
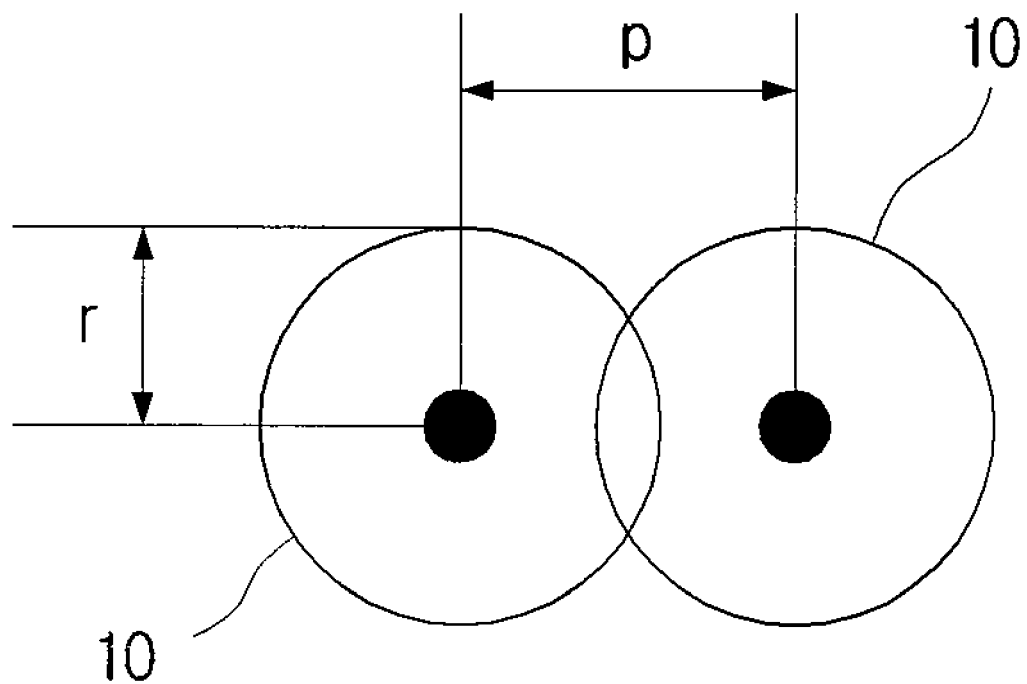
FIG. 2 is a plan view illustrating ink blots formed in an overlapping manner.

FIG. 1 is a flowchart illustrating a method of processing image data in accordance with an embodiment of the present invention, FIG. 2 is a plan view illustrating ink blots formed in an overlapping manner, and FIGS. 3 to 8 are flow diagrams illustrating a method of processing image data in accordance with an embodiment of the present invention.

First of all, a radius R of a pad to be printed, a radius r of an ink blot to be ejected, base pitch P as a basis for a degree of the ejected ink blots in an overlapping manner, and tolerance T can be set and inputted (S110).

Here, as illustrated in FIG. 2, the radius r of the ink blot means a radius of a circular mark formed as an ink 10 hits a substrate, etc., not a radius of a spherical ink droplet before it hits the substrate, etc.

The pitch here means a distance between the center points of ink blots 10 that are formed in a partially overlapping manner, as illustrated in FIG. 2. The base pitch P can be set by the designer.

Figure 3:
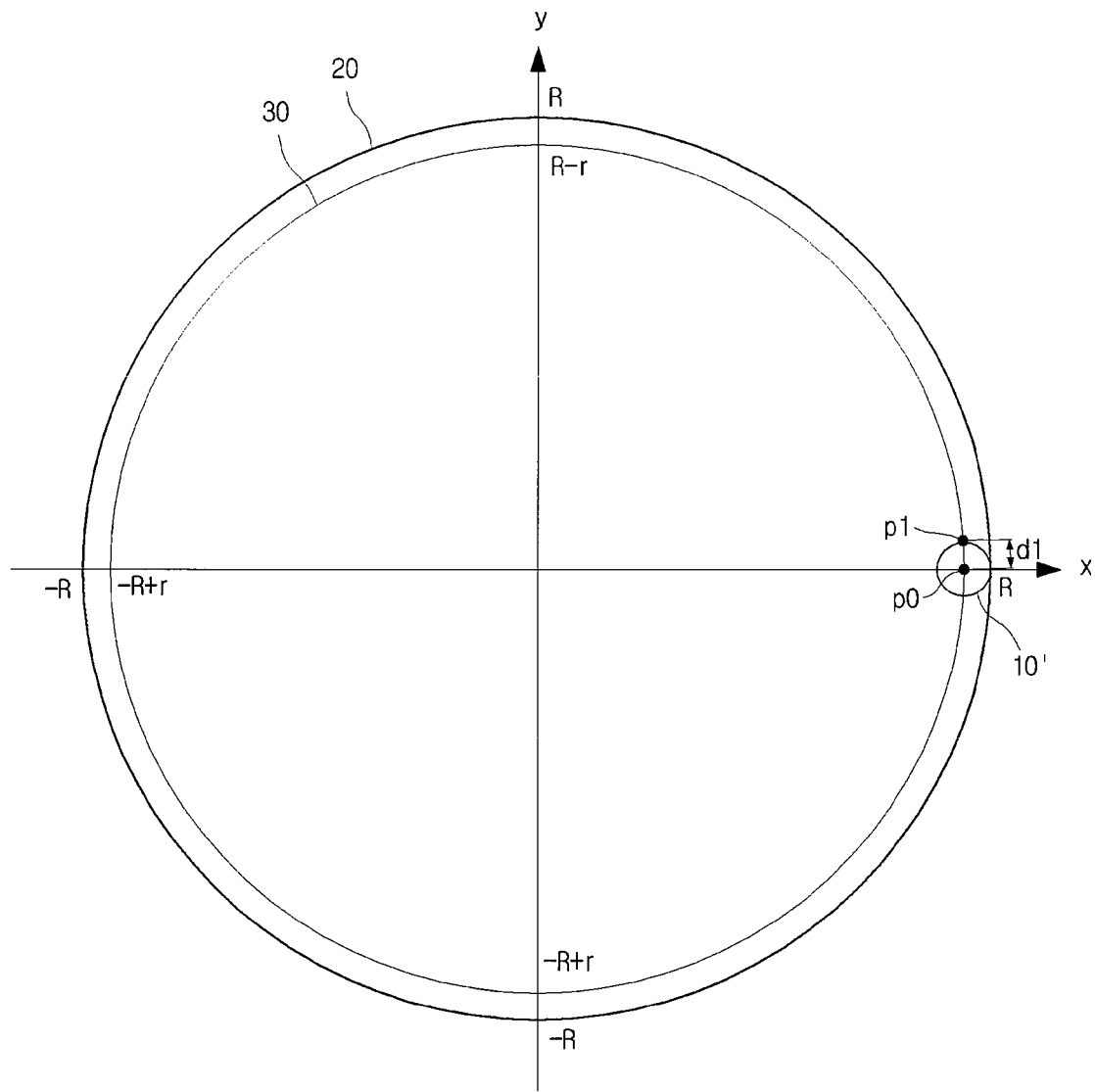
FIG. 3, FIG. 4, FIG. 5, FIG. 6, FIG. 7, and FIG. 8 are flow diagrams illustrating a method of processing image data in accordance with an embodiment of the present invention.

After that, as illustrated in FIG. 3, first image data 20 about the edge of the pad to be printed can be arranged in an x-y coordinate system (S120). The x-y coordinate system can be set with various values of unit distance by the designer in accordance with desired resolution (dpi). The first image data 20 can be vector data, i.e. Gerber data, or data converted from the vector data by using Bresenham's algorithm.

And then, second image data 30 with a smaller radius than the radius of the first image data 20 can be generated as the second image data shares the center with the first image data 20 (S130). Then, a base point p0 can be arranged on the second image data 30 (S140).

Here, a radius of the second image data 30 can be R−r as shown in FIG. 3. While the radius of the second image data 30 is R−r, an effect of an ink blot being spread beyond the boundary of the first image data 20 can be eliminated, when the ink blot having a radius of r is ejected on a coordinate located on the second image data.

For the reason above, in the present embodiment, a coordinate (R−r, 0) can be selected as the base point p0 in an x-y coordinate system, as shown in FIG. 3.

Figure 4:
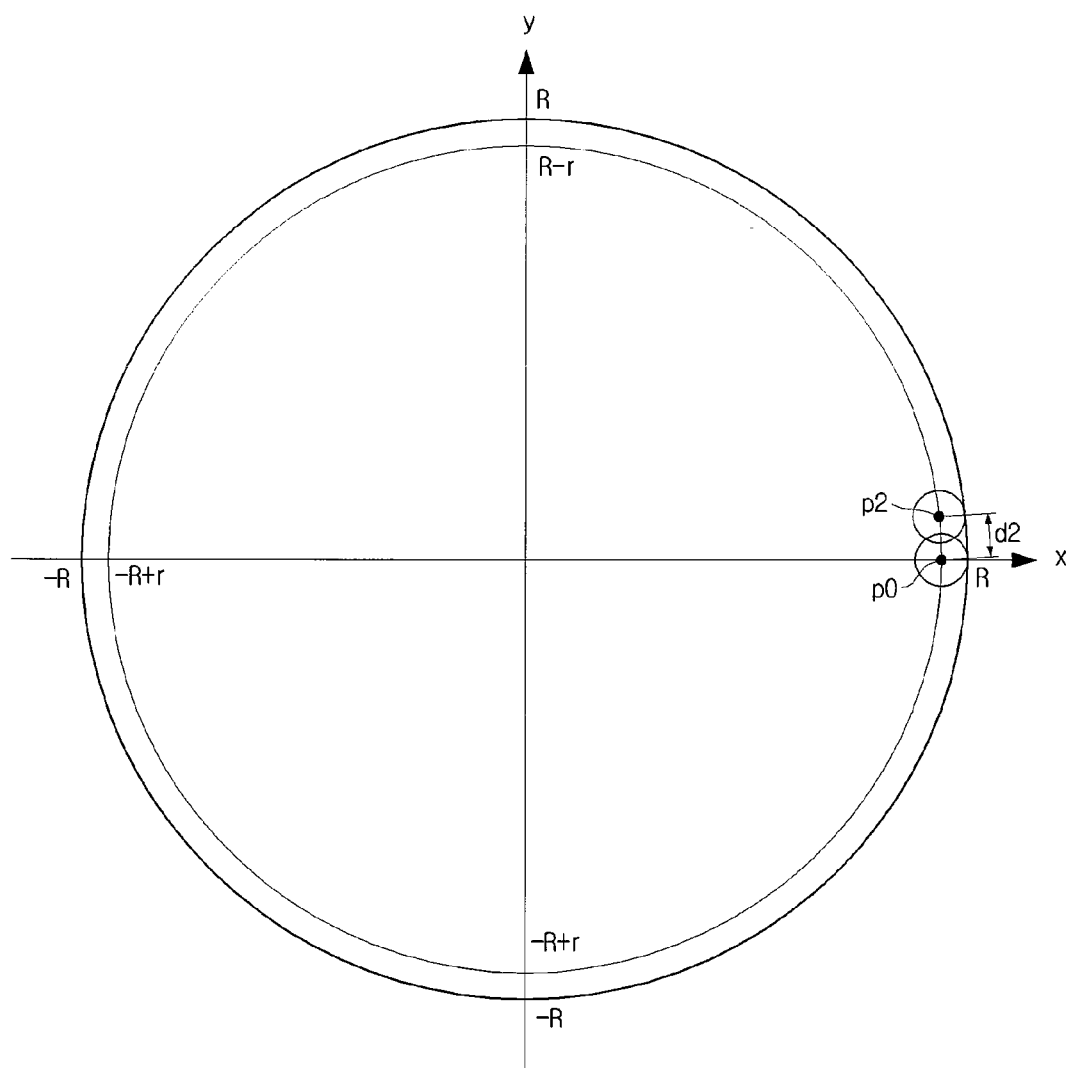
Figure 5:
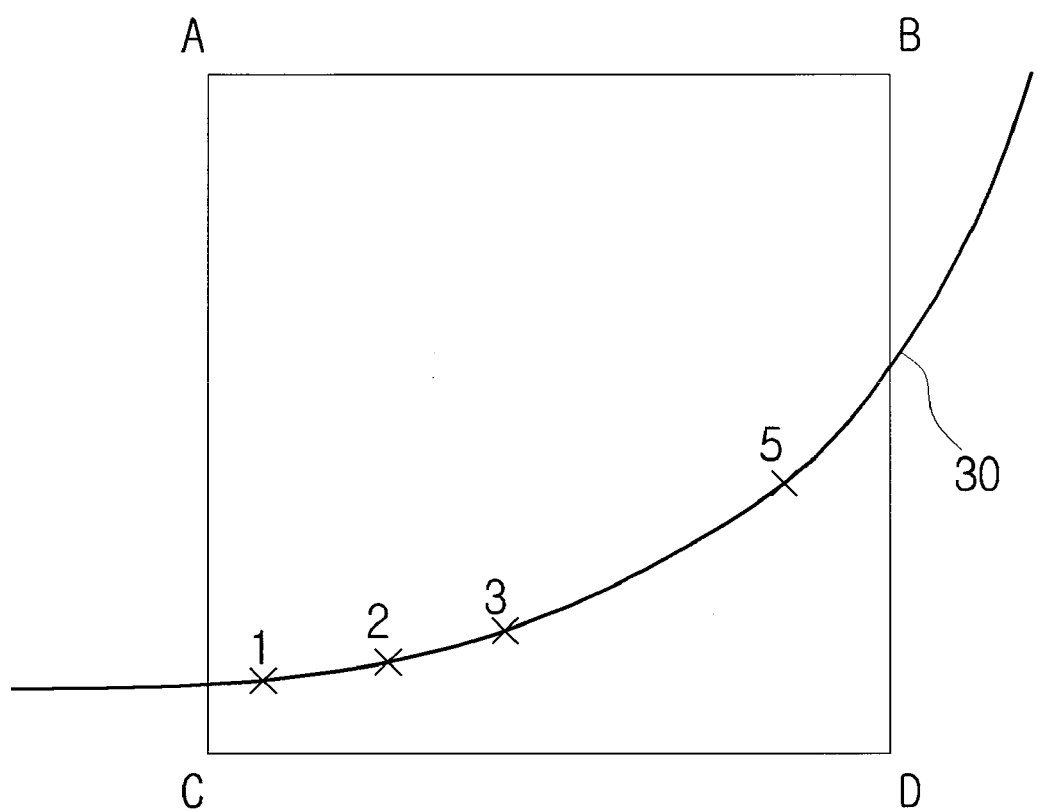

After that, as shown in FIG. 3 and FIG. 4, a determination point (p1, p2) on the second image data 30 can be selected as a point separated from the base point p0 (S150). Whether a distance between the base point p0 and the determination point (p1, p2) is within a permissible pitch range can be determined (S160). Here, the permissible pitch range means a value ranging from P−T to P+T; which reflects tolerance T to the base pitch P as inspired by the designer.

The reference numeral 10' in FIG. 3 can represent a simulated ink blot taking into consideration a size of an ink droplet ejected from an inkjet head.

When determining, if the distance between the base point p0 and the determination point is within the permissible pitch range in case of FIG. 4, a coordinate located at a shortest distance from the determination point can be stored as print data (S170).

If the second image data 30 is vector data the second image data can be not located on any of coordinates A, B, C, D in an x-y coordinate system. That is, the determination point can be located on any of coordinates 1, 2, 3, 5, but not on any of the coordinates A, B, C, D.

Unlike the vector data, print data for printing an inkjet may have to be stored in a raster data format, i.e. bitmap data. Therefore, in case the determination point is located on any of the coordinates 1, 2, 3, 5, any of the coordinates A, B, C, D can be stored as print data.

A method of selecting a coordinate located at a shortest distance from the determination point is to select any of the four coordinates, which has the shortest distance from the determination point to each of the four coordinates by analyzing mathematically.

If the determination point is located on any of the coordinates in an x-y coordinate system, the coordinate can be stored as print data.

When selecting a coordinate located at a shortest distance from the determination point, coordinates located on an inner side of the second image data 30 can be only considered. Thus, in case of FIG. 5, coordinates of A and B can be only considered among the four coordinates of A, B, C, D.

Therefore, when the ink blot having the radius of r is ejected on the coordinate, the effect of the ink blot being spread beyond the boundary of the first image data 20 can be eliminated, when the ink having the radius r is ejected from a inkjet head onto one of the coordinates.

By considering such a point described above, if the determination points are 1, 2, and 3, the coordinate of A can be stored as print data, and if the determination point is 5, the coordinate of B can be stored as print data.

On the other hand, if the distance from the base point to the determination point is beyond the permissible pitch range in case of FIG. 3, the determination point p1 can be moved on the image data (S180). And then, whether the distance between the base point p0 and the determination point is within the a permissible pitch range can be determined (S160). Here, p2 illustrated in FIG. 4 indicates a point that has moved on the second image data 30 from p1 illustrated in FIG. 3.

Figure 6:
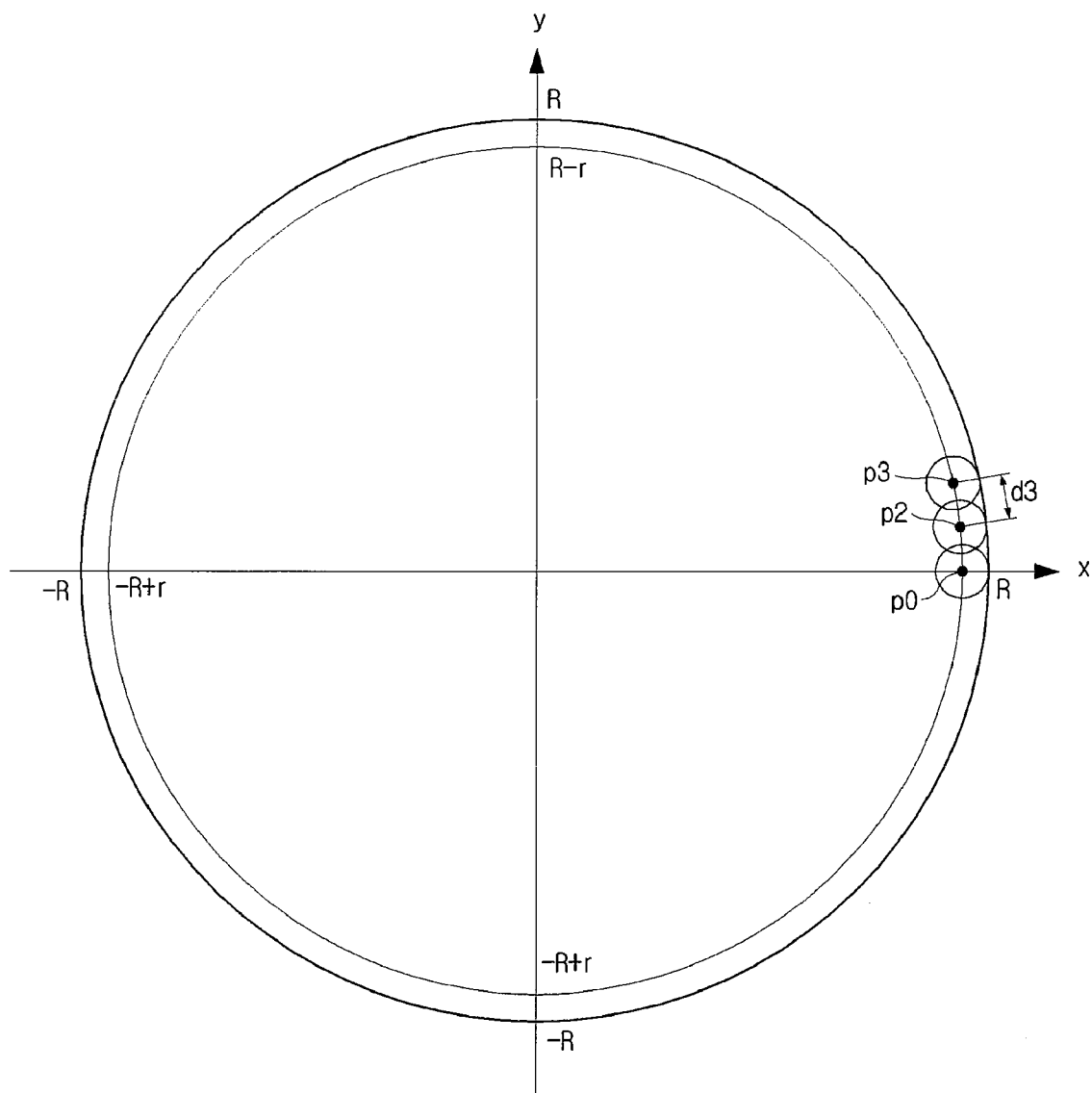

After such processes above, a coordinate of p2 stored as print data can be selected as a new base point, as illustrated in FIG. 6 (S190). After that, a new determination point p3 can be selected from the coordinate of p2 (S150), and then the processes described above can be repeated.

That is, whether a distance between the new base point p2 and the new determination point p3 is within the permissible pitch range can be determined (S160), and if the distance is within the permissible pitch range, a coordinate located at a shortest distance from the determination point p3 can be stored as additional print data (S170).

Figure 7:
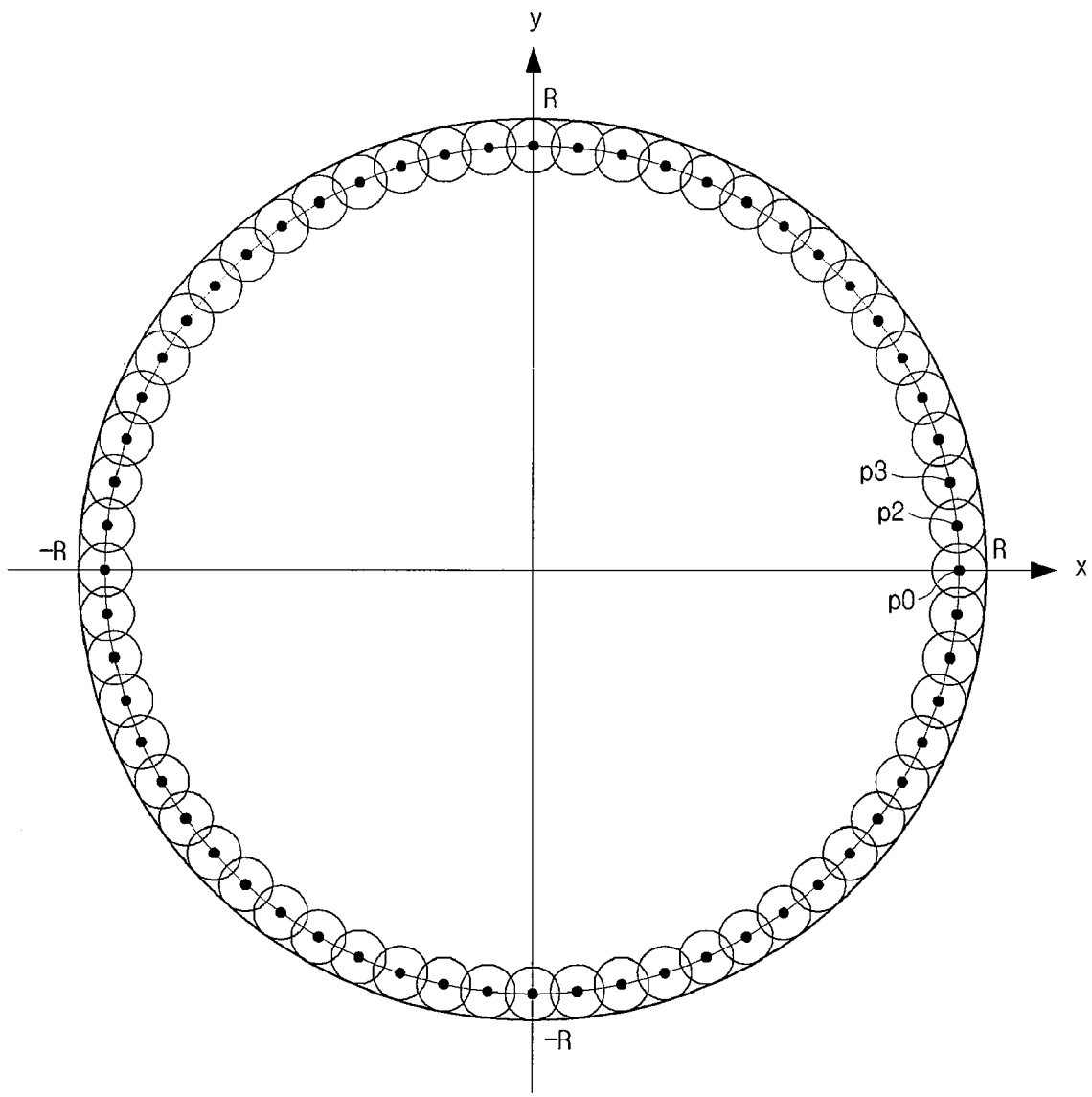
Figure 8:
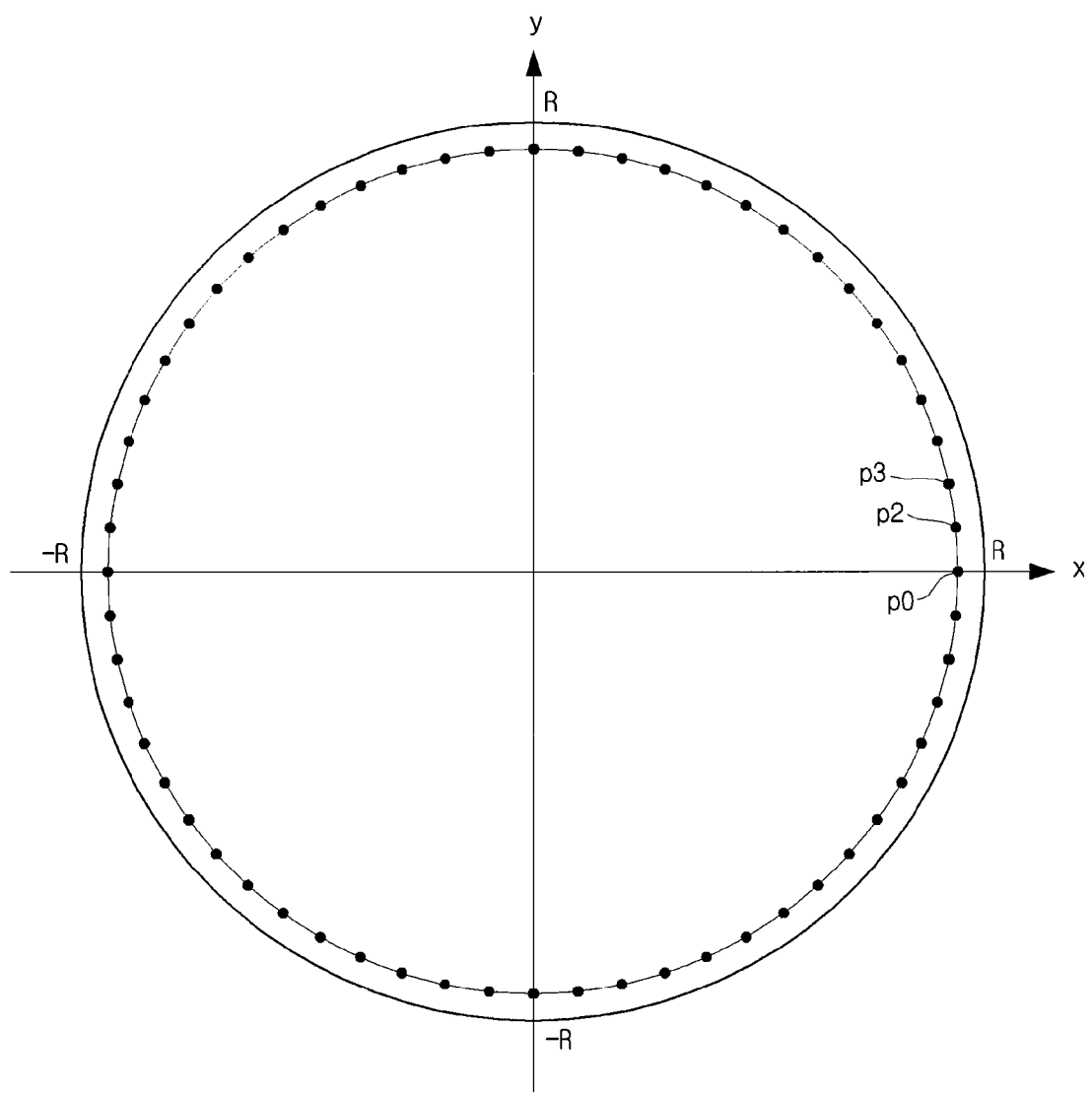

By repeating the processes above, all print data for printing an edge of the circular pad can be completely stored, as illustrated in FIG. 7 and FIG. 8. Dots illustrated in FIG. 8 show spots on which ink blots may be ejected from the inkjet head.

Next, another embodiment of the invention provides a method of processing image data with reference to FIGS. 9 to FIG. 12. However, certain detailed explanations of the described embodiments are omitted, when it is repeated, and the difference is mainly described.

Figure 9:
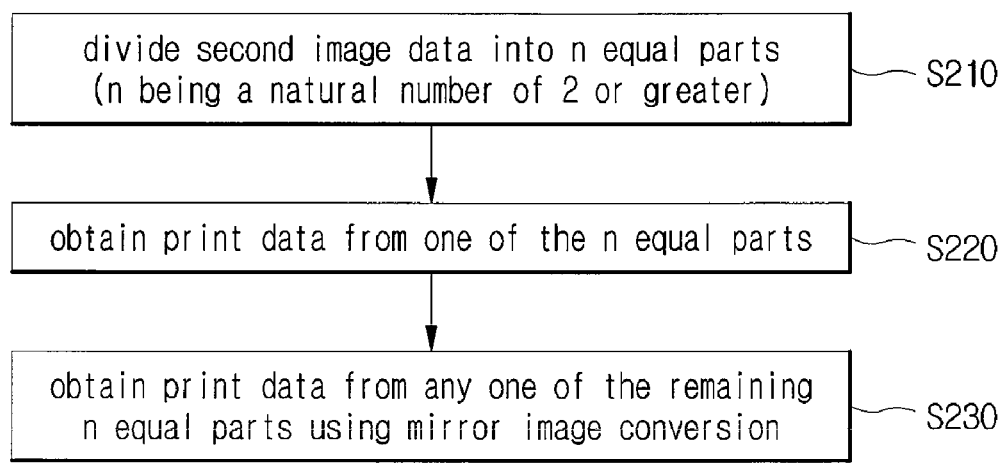
FIG. 9 is a flowchart illustrating a method of processing image data in accordance with another embodiment of the present invention.
Figure 10:
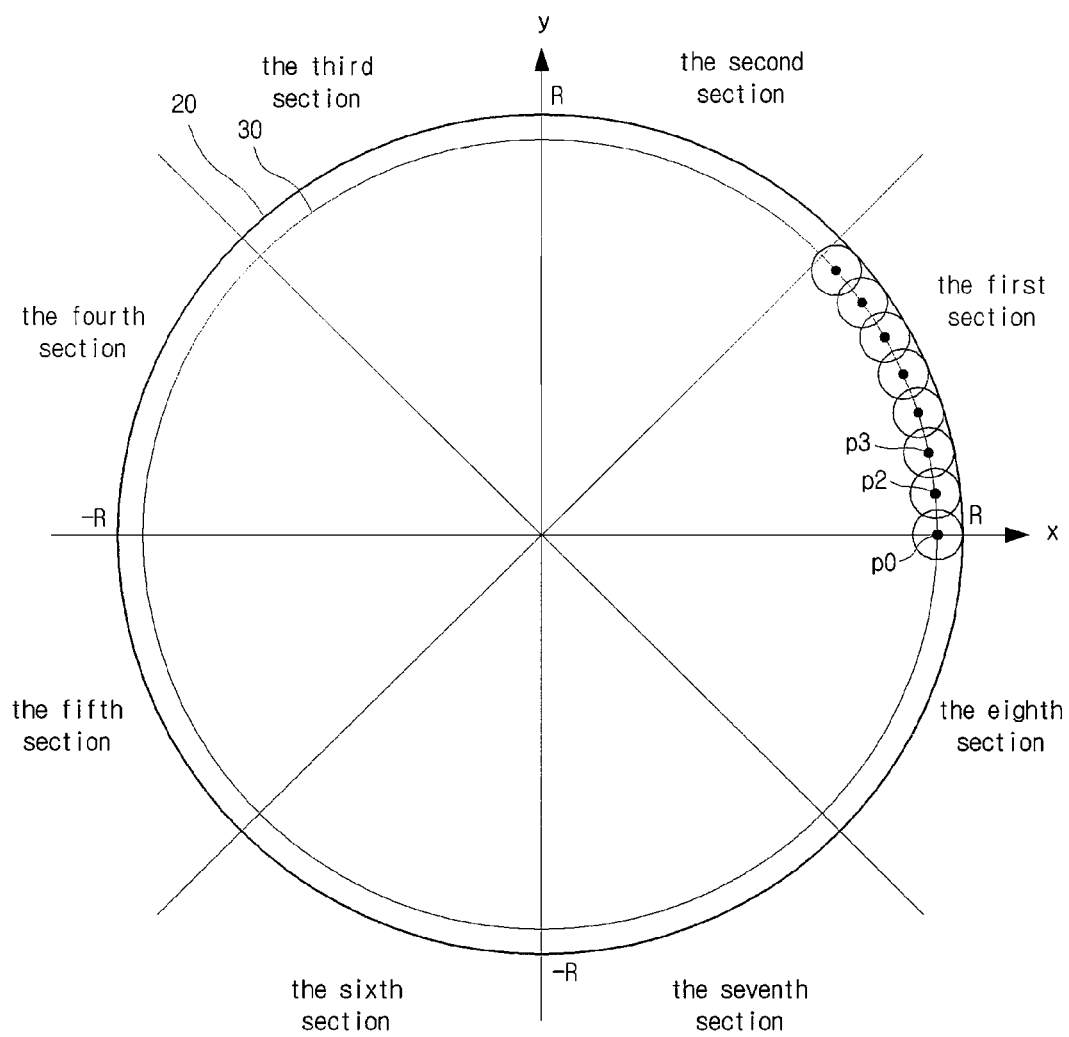
FIG. 10, FIG. 11, and FIG. 12 are flow diagrams illustrating a method of processing image data in accordance with another embodiment of the present invention.
Figure 11:
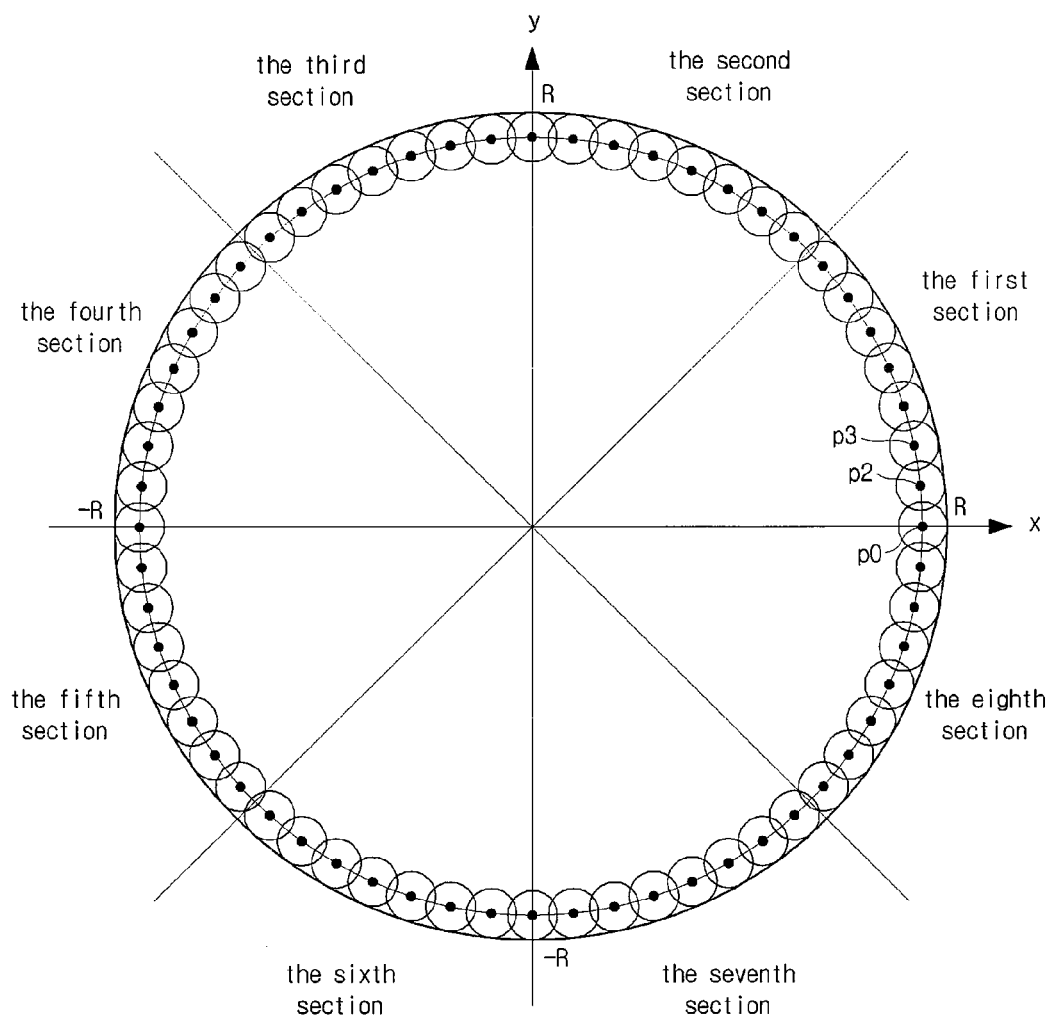
Figure 12:
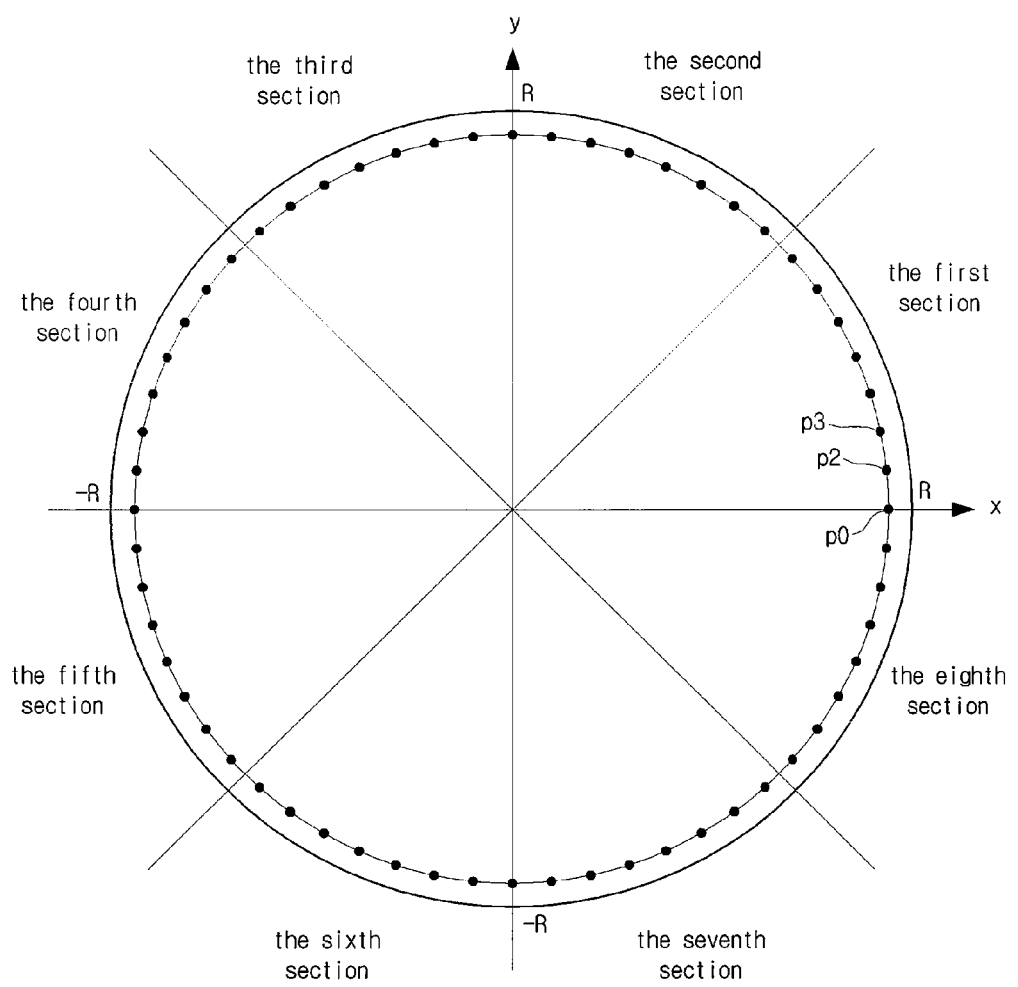

FIG. 9 is a flowchart illustrating a method of processing image data in accordance with another embodiment of the present invention, and FIGS. 10 to FIG. 12 are flow diagrams illustrating a method of processing image data in accordance with another embodiment of the present invention.

A method of processing image data according to another embodiment of the present invention can include: dividing the second image data 30 into n equal parts (S210), in which the storing as print data is performed for one of the n equal parts (S220), and print data for any one of the remaining n equal parts is obtained by mirror image conversion (S230). Here, the mirror image conversion means a method of mathematically obtaining print data in a determined part to which an axis of symmetry, i.e. a parallel axis x, a vertical axis y, and an oblique line y=x, is centered, so that image conversion may be performed.

For better mirror image conversion, the second image data 30 can be divided into n equal parts (n being an even number). When dividing the second image date 30 into even parts, print data for all sections can be easily obtained by using one print data obtained from a section through the mirror image conversion using bisymmetry of the parallel axis x, the vertical axis y, and the oblique line y=x.

FIGS. 10 to 12 show the second image data 30 divided into 8 parts and a process of obtaining print data about a first section. However, it is apparent that it may be convenient for the designer dividing the image data into 2 or 4 parts, or even dividing into odd parts.

Here, as shown in FIG. 10, the method of obtaining print data from a certain part is the same as the processes described above, so that detailed explanations of the processes will be omitted hereinafter.

FIG. 11 and FIG. 12 show print data about the edge of the pad, completely obtained for a line pattern. Each dot illustrated in FIGS. 11 to 12 refers to a spot on which an ink blot may be ejected from the inkjet head.

Generalized and detailed aspects of the method of processing image data, as disclosed using the present embodiments, can be tangibly implemented as a recorded medium readable by a computer, etc., that stores a program of instructions executable by the computer, etc.

Certain detailed explanations of the described embodiments are omitted, when it is repeated.

By utilizing certain embodiments of the invention as set forth above, a pad can be printed with a high level of surface smoothness and high reliability to satisfy the resolution and ink density requirements needed by the user.

While the spirit of the invention has been described in detail with reference to particular embodiments, the embodiments are for illustrative purposes only and do not limit the invention. It is to be appreciated that those skilled in the art can change or modify the embodiments without departing from the scope and spirit of the invention.

Many embodiments other than those set forth above can be found in the appended claims.

What is claimed is:

1. A method of processing image data to obtain image data for printing an edge of a circular pad having a radius of R by forming ink blots having a radius of r in an overlapping manner, the method comprising:
    setting a permissible pitch range for a distance between adjacent ink blots;
    arranging first image data about the edge of the pad in an x-y coordinate system;
    generating second image data with a smaller radius than the radius of the first image data, the second image data sharing the center with the first image data;
    arranging a first base point on the second image data;
    selecting a first determination point on the second image data, the first determination point separated from the first base point;
    determining whether a distance between the first base point and the first determination point is within the permissible pitch range; and
    storing a coordinate as print data if the distance from the first base point to the first determination point is within the permissible pitch range, the coordinate located at a shortest distance from the first determination point.

2. The method of claim 1, wherein a radius of the second image data is R−r.

3. The method of claim 1, further comprising, if the distance from the first base point to the first determination point is beyond the permissible pitch range:
    moving the first determination point on the second image data; and
    repeating the determining of whether the distance between the first base point and the first determination point is within the permissible pitch range.

4. The method of claim 1, wherein the first image data is obtained by converting vector data of the edge of the pad by using Bresenham's algorithm.

5. The method of claim 1, wherein the storing of a coordinate located at the shortest distance from the determination point as print data is performed for a coordinate located inside the second image data.

6. The method of claim 1, further comprising, after the storing of the coordinate located at the shortest distance from the first determination point as print data:
    arranging the stored coordinate as a second base point;
    selecting a second determination point on the second image data, the second determination point separated from the second base point;
    determining whether a distance between the second base point and the second determination point is within the permissible pitch range; and
    storing a coordinate as print data if the distance between the second base point and the second determination point is within the permissible pitch range, the coordinate located at a shortest distance from the second determination point.

7. The method of claim 1, further comprising dividing the second image data into n equal parts, (n being a natural number of 2 or greater),
    wherein the storing as print data is performed for one of the n equal parts, and print data for any one of the remaining n equal parts is obtained by mirror image conversion.

8. The method of claim 7, wherein the natural number n is an even number.

9. A recorded medium tangibly embodying a program of instructions for performing a method of processing image data to obtain image data for printing an edge of a circular pad having a radius of R by forming ink blots having a radius of r in an overlapping manner, the method comprising:

setting a permissible pitch range for a distance between adjacent ink blots;

arranging first image data about the edge of the pad in an x-y coordinate system;

generating second image data with a smaller radius than the radius of the first image data, the second image data sharing the center with the first image data;

arranging a first base point on the second image data;

selecting a first determination point on the second image data, the first determination point separated from the first base point;

determining whether a distance between the first base point and the first determination point is within the permissible pitch range; and storing a coordinate as print data if the distance from the first base point to the first determination point is within the permissible pitch range, the coordinate located at a shortest distance from the first determination point.

10. The recorded medium of claim 9, wherein a radius of the second image data is R−r.

11. The recorded medium of claim 9, further comprising, if the distance from the first base point to the first determination point is beyond the permissible pitch range:

moving the first determination point on the second image data; and repeating the determining of whether the distance between the first base point and the first determination point is within the permissible pitch range.

12. The recorded medium of claim 9, wherein the first image data is obtained by converting vector data of the edge of the pad by using Bresenham's algorithm.

13. The recorded medium of claim 9, wherein the storing of a coordinate located at the shortest distance from the determination point as print data is performed for a coordinate located inside the second image data.

14. The recorded medium of claim 9, further comprising, after the storing of the coordinate located at the shortest distance from the first determination point as print data:

arranging the stored coordinate as a second base point;

selecting a second determination point on the second image data, the second determination point separated from the second base point;

determining whether a distance between the second base point and the second determination point is within the permissible pitch range; and storing a coordinate as print data if the distance between the second base point and the second determination point is within the permissible pitch range, the coordinate located at a shortest distance from the second determination point.

15. The recorded medium of claim 9, further comprising dividing the second image data into n equal parts, (n being a natural number of 2 or greater), wherein the storing as print data is performed for one of the n equal parts, and print data for any one of the remaining n equal parts is obtained by mirror image conversion.

16. The recorded medium of claim 15, wherein the natural number n is an even number.

* * * * *